(12) United States Patent
Moon et al.

(10) Patent No.: US 11,309,923 B2
(45) Date of Patent: Apr. 19, 2022

(54) METHOD USING SIGNAL COMPONENT OF MULTIPLIED FREQUENCY AND ELECTRONIC DEVICE THEREFOR

(71) Applicant: Samsung Electronics Co., Ltd., Suwon-si (KR)

(72) Inventors: Yohan Moon, Suwon-si (KR); Dongil Yang, Suwon-si (KR); Seonjun Kim, Suwon-si (KR); Jonghun Yoo, Suwon-si (KR); Jongin Lee, Suwon-si (KR); Namjun Cho, Suwon-si (KR); Hyoseok Na, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/036,534

(22) Filed: Sep. 29, 2020

(65) Prior Publication Data

US 2021/0105027 A1    Apr. 8, 2021

(30) Foreign Application Priority Data

Oct. 4, 2019    (KR) ........................ 10-2019-0122913

(51) Int. Cl.
*H04B 1/04*    (2006.01)
*H03F 3/24*    (2006.01)
(Continued)

(52) U.S. Cl.
CPC .......... *H04B 1/0458* (2013.01); *H03F 3/245* (2013.01); *H04B 1/0475* (2013.01); *H04B 1/40* (2013.01); *H03F 2200/451* (2013.01)

(58) Field of Classification Search
None
See application file for complete search history.

(56) References Cited

U.S. PATENT DOCUMENTS 8,779,965 B2    7/2014    Sentelle et al.
8,983,411 B2 *  3/2015    Rozenblit ............ H04B 1/0475
                                                                455/127.2
(Continued)

OTHER PUBLICATIONS

International Search Report dated Jan. 26, 2021, issued in International Application No. PCT/KR2020/013209.

*Primary Examiner* — Pablo N Tran
(74) *Attorney, Agent, or Firm* — Jefferson IP Law, LLP

(57) ABSTRACT

An electronic device is provided. The electronic device includes an antenna, a transmission path electrically connected to the antenna and including at least one amplifier, a transceiver connected to the transmission path and converting a signal, a feedback path connected between the transmission path and the transceiver, at least one processor connected to the transceiver and communicating with at least one external electronic device by using the transceiver, and a memory connected to the at least one processor. The processor may obtain first information about a first phase and a first magnitude, which are associated with the first frequency, and second information about a second phase and a second magnitude, which are associated with a multiplied frequency of the first frequency, from the transmission signal and the reflection signal using the transceiver, and may determine a state of the electronic device based on the first information and the second information.

21 Claims, 11 Drawing Sheets

(51) Int. Cl.
*H04B 1/40* (2015.01)
*G01R 29/10* (2006.01)

(56) References Cited

U.S. PATENT DOCUMENTS

| | | |
|---|---|---|
| 9,214,908 B2 | 12/2015 | Geurts et al. |
| 9,229,102 B1 | 1/2016 | Wright et al. |
| 9,316,727 B2 | 4/2016 | Sentelle et al. |
| 9,374,056 B2 | 6/2016 | Bagger et al. |
| 9,753,121 B1 | 9/2017 | Davis et al. |
| 9,829,567 B1 | 11/2017 | Davis et al. |
| 10,184,973 B2 * | 1/2019 | Nobbe .................... H03F 3/195 |
| 10,571,502 B2 | 2/2020 | Pascolini |
| 10,775,478 B2 | 9/2020 | Davis et al. |
| 2011/0117862 A1 | 5/2011 | Bagger et al. |
| 2013/0113647 A1 | 5/2013 | Sentelle et al. |
| 2013/0331042 A1 * | 12/2013 | See ........................ H04B 17/12 |
| | | 455/77 |
| 2014/0024321 A1 * | 1/2014 | Zhu ........................ H04B 1/18 |
| | | 455/77 |
| 2015/0078420 A1 * | 3/2015 | Geurts .................. H03F 1/3211 |
| | | 375/148 |
| 2015/0119115 A1 | 4/2015 | Bagger et al. |
| 2015/0301167 A1 | 10/2015 | Sentelle et al. |
| 2015/0309166 A1 | 10/2015 | Sentelle et al. |
| 2015/0355251 A1 | 12/2015 | Pascolini |
| 2016/0211820 A1 * | 7/2016 | Bagger ..................... H04L 5/14 |
| 2018/0038903 A1 * | 2/2018 | Pascolini ............... G01R 29/10 |
| 2018/0054196 A1 | 2/2018 | Yang et al. |
| 2018/0081029 A1 | 3/2018 | Davis et al. |

* cited by examiner

METHOD USING SIGNAL COMPONENT OF MULTIPLIED FREQUENCY AND ELECTRONIC DEVICE THEREFOR

CROSS-REFERENCE TO RELATED APPLICATION(S)

This application is based on and claims priority under 35 U.S.C. § 119(a) of a Korean patent application number 10-2019-0122913, filed on Oct. 4, 2019, in the Korean Intellectual Property Office, the disclosure of which is incorporated by reference herein in its entirety.

BACKGROUND

1. Field

The disclosure relates to a method of using a signal component of a multiplied frequency and an electronic device therefor.

2. Description of Related Art

An electronic device may transmit a signal of a specified frequency, using a communication circuit. The electronic device may communicate with an external electronic device by transmitting a signal of a specified frequency and receiving a signal from the outside. As the size of the electronic device decreases, the size of an antenna of the electronic device may also decrease. In this case, the antenna may be blocked by an external object. Furthermore, as the usage period of the electronic device increases, a malfunction or degradation may occur in a configuration associated with signal transmission of the electronic device. The electronic device may monitor a transmission signal to detect temporary and/or permanent abnormal states associated with the communication circuit. The electronic device may include a feedback path coupled to a transmission path to monitor a transmission signal. For example, the electronic device may obtain not only the transmission signal transmitted through the transmission path, but also a reflection signal entered into the transmission path through a feedback path.

The above information is presented as background information only to assist with an understanding of the disclosure. No determination has been made, and no assertion is made, as to whether any of the above might be applicable as prior art with regard to the disclosure.

SUMMARY

An electronic device may transmit a signal of a specified frequency and may obtain a transmission signal through a feedback path. The electronic device may obtain a reflection signal of the transmission signal through the feedback path. For example, an electronic device may transmit a signal of a specified frequency. In this case, the transmitted signal may be reflected by an external object. The reflection signal may be entered into the transmission path through an antenna of the electronic device; the electronic device may obtain the entered reflection signal through the feedback path. While the reflection signal is reflected by an external object, the magnitude and phase of the reflection signal may be changed. The electronic device may determine whether the transmission path is blocked based on the magnitude and phase difference between the reflection signal and the transmission signal.

The electronic device may attempt to detect an external object using the transmission signal and the reflection signal. In this case, the phase and magnitude of the reflection signal may be changed depending on the properties of the external object. Accordingly, when detecting an external object using self-frequency of the transmission signal, the electronic device may fail to detect the external object.

Aspects of the disclosure are to address at least the above-mentioned problems and/or disadvantages and to provide at least the advantages described below. Accordingly, an aspect of the disclosure is to provide a method for determining various states of an electronic device using a signal component of a multiplied frequency and an electronic device therefor.

Additional aspects will be set forth in part in the description which follows and, in part, will be apparent from the description, or may be learned by practice of the presented embodiments.

In accordance with an aspect of the disclosure, an electronic device is provided. The electronic device includes an antenna, a transmission path electrically connected to the antenna and including at least one amplifier, a transceiver connected to the transmission path and converting a signal, a feedback path connected between the transmission path and the transceiver, at least one processor connected to the transceiver and communicating with at least one external electronic device by using the transceiver, and a memory connected to the at least one processor. The memory may store one or more instructions that, when executed, cause the at least one processor to transmit a first signal of a first frequency through the transmission path, using the transceiver, to obtain a transmission signal and a reflection signal of the transmission signal, which are associated with transmission of the first signal, through the feedback path using the transceiver, to obtain first information about a first phase and a first magnitude, which are associated with the first frequency, and second information about a second phase and a second magnitude, which are associated with a multiplied frequency of the first frequency, from the transmission signal and the reflection signal using the transceiver, and to determine a state of the electronic device based on the first information and the second information.

In accordance with another aspect of the disclosure, a method of determining a state of an electronic device is provided. The method includes transmitting a first signal of a first frequency through a transmission path connected to an antenna of the electronic device and including at least one amplifier, obtaining a transmission signal and a reflection signal of the transmission signal, which are associated with transmission of the first signal, through a feedback path coupled to the transmission path, obtaining first information about a first phase and a first magnitude, which are associated with the first frequency, and second information about a second phase and a second magnitude, which are associated with a multiplied frequency of the first frequency, from the transmission signal and the reflection signal, and determining a state of the electronic device based on the first information and the second information.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
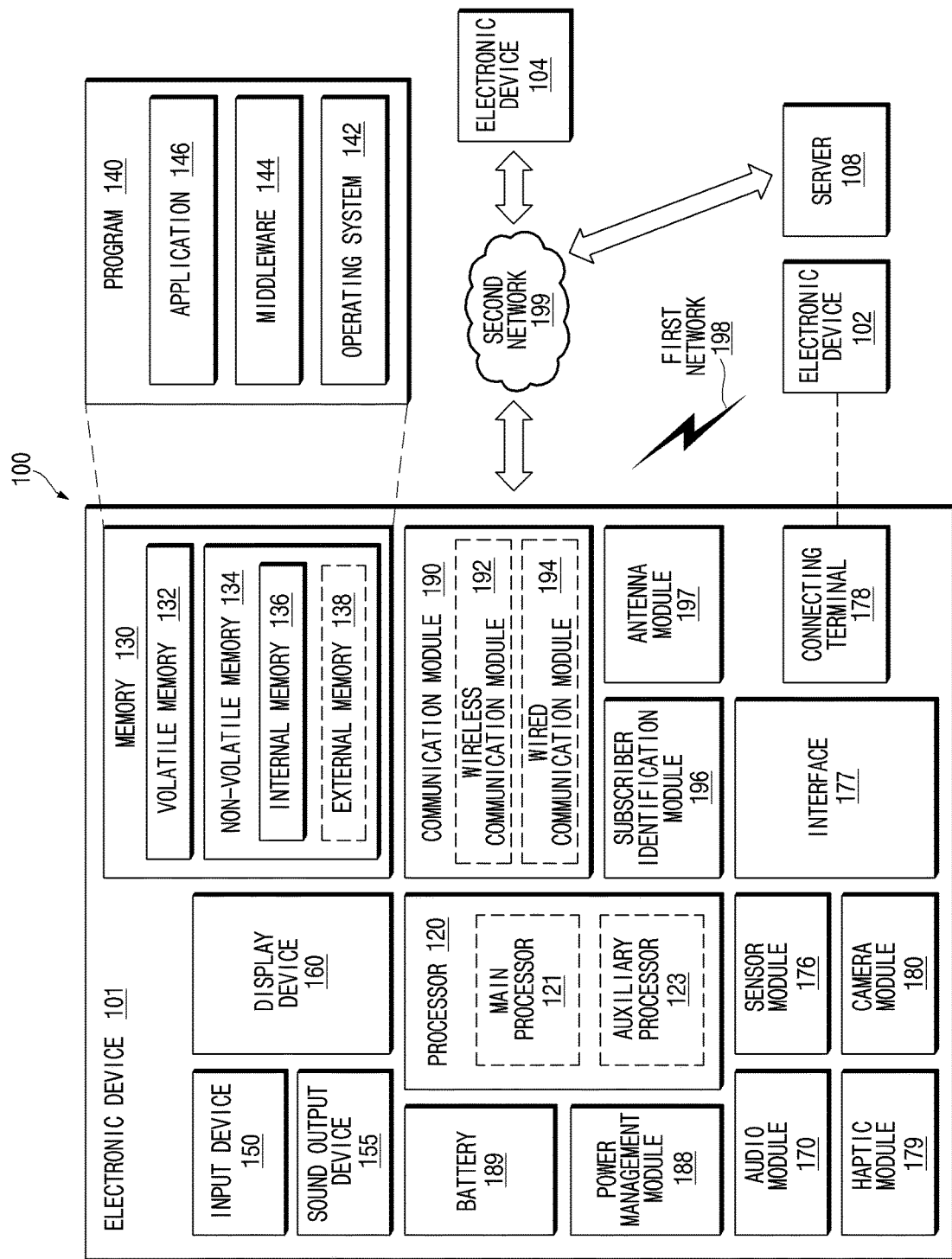
FIG. 1 is a block diagram of an electronic device in a network environment according to an embodiment of the disclosure.

FIG. 1 is a block diagram illustrating an electronic device 101 in a network environment 100 according to an embodiment of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment of the disclosure, the electronic device 101 may communicate with the electronic device 104 via the server 108. According to an embodiment of the disclosure, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments of the disclosure, at least one (e.g., the display device 160 or the camera module 180) of the components may be omitted from the electronic device 101, or one or more other components may be added in the electronic device 101. In some embodiments of the disclosure, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment of the disclosure, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment of the disclosure, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment of the disclosure, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment of the disclosure, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment of the disclosure, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment of the disclosure, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, image signal processors, or flashes.

The power management module 188 may manage power supplied to the electronic device 101. According to one embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment of the disclosure, the antenna module 197 may include an antenna including a radiating element including a conductive material or a conductive pattern formed in or on a substrate (e.g., PCB). According to an embodiment of the disclosure, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment of the disclosure, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

Figure 2:
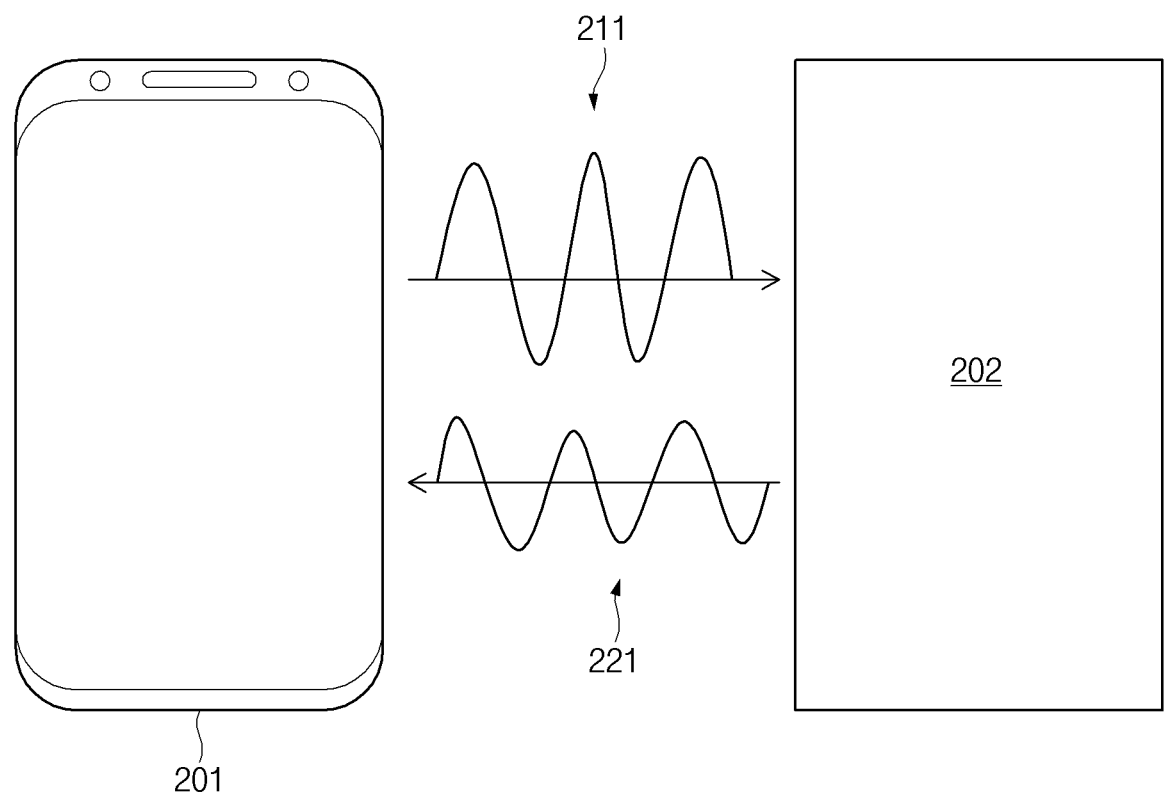
FIG. 2 illustrates a method for determining a state of an electronic device according to an embodiment of the disclosure.

FIG. 2 illustrates a method for determining a state of an electronic device according to an embodiment of the disclosure.

Referring to FIG. 2, an electronic device 201 (e.g., the electronic device 101 of FIG. 1) may determine the state of the electronic device 201 by transmitting a signal to the outside of the electronic device 201. For example, the electronic device 201 may transmit a transmission signal 211 and may obtain a reflection signal 221 obtained as the transmission signal 211 is reflected by an external object 202. The above-described reflection signal 221 is exemplary, and embodiments of the disclosure are not limited thereto. The electronic device 201 has transmitted a signal. However, the electronic device 201 may obtain a reflected signal that is unable to be radiated through an antenna due to the blockage (e.g., blockage due to gripping, or the like) of the electronic device 201. Hereinafter, for example, the reflection signal may mean a signal that is not radiated to an exterior through an antenna and is reflected back to a communication circuit of the electronic device 201 and/or the reflection signal 221 reflected by the external object 202. For example, hereinafter, the reflection signal may be referred to as a signal associated with a transmission signal of the electronic device or a signal corresponding to the transmission signal. The signal associated with the transmission signal or the signal corresponding to the transmission signal may be referred to as a signal induced or received in the communication circuit (e.g., an antenna of the communication circuit) of the electronic device 201 by the transmission signal.

According to an embodiment of the disclosure, the electronic device 201 may determine the state of the electronic device 201 based on the phase and/or magnitude associated with the transmission signal 211 and the phase and/or magnitude associated with the reflection signal. For example, the electronic device 201 may compare the phase and/or magnitude of the transmission signal 211 transmitted from the electronic device 201 with the phase and/or magnitude of the reflection signal, and then may determine the state of the electronic device 201. For example, the state of the electronic device 201 may include whether the electronic device 201 is blocked and/or the identification of the external object 202 adjacent to the electronic device 201. The electronic device 201 may determine the state of the electronic device 201 by comparing the phase and/or magnitude of the transmission signal 211 and the reflection signal with a value (e.g., a lookup table) stored in a memory (e.g., the memory 130 in FIG. 1).

In various embodiments of the disclosure, to determine the state of the electronic device 201, the electronic device 201 may use the multiplied frequency of a self-frequency of the transmission signal 211. The self-frequency may be referred to as a center frequency, fundamental frequency, or carrier frequency of the transmission signal 211. For example, the electronic device 201 may transmit the transmission signal 211 through a wireless circuit including various components. When the wireless circuit includes a non-linear component (e.g., an amplifier, transistor, diode, or the like), a harmonic signal of the transmission signal 211 may be generated through a wireless circuit. The harmonic signal may have a center frequency corresponding to the multiplied frequency of the self-frequency of the transmission signal 211. For example, when the self-frequency of the transmission signal 211 is f1, the transmission signal 211 may include at least one harmonic component (e.g., the multiplied frequency component that is N times as many as f1 (e.g., N is a natural number of 2 or more)) due to the harmonic component. In this case, the signal component (e.g., the harmonic component) of a multiplied frequency may be also included in the reflection signal. According to an embodiment of the disclosure, the electronic device 201 may determine the state of the electronic device 201, using the multiplied frequency signal component of at least one of the transmission signal 211 and the reflection signal. For example, when the self-frequency of the transmission signal 211 is f1, the electronic device 201 may determine the state of the electronic device 201, using the magnitude and/or phase of the signal component of the multiplied frequency (e.g., at least one of 2*f1, 3*f1, . . . N*f1) of the at least one of the transmission signal 211 and the reflection signal. For another example, the electronic device 201 may determine the state of the electronic device 201, using the magnitude and/or phase of the self-frequency signal component and at least one multiplied frequency signal component of the transmission signal 211 and the reflection signal. The electronic device 201 may determine the state of the electronic device 201 more accurately by determining the state of the electronic device 201 using a multiplied frequency component. According to an embodiment of the disclosure, the electronic device 201 may determine the state of the electronic device 201, using the multiplied frequency and/or self-frequency signal component of at least one of the transmission signal 211 and the reflection signal. The electronic device 201 may determine the state of the electronic device 201 by comparing the phase and magnitude of the multiplied frequency and/or self-frequency signal component with values stored in the memory. For example, information about the phase and magnitude of a signal component of the self-frequency and at least one multiplied frequency, which are set for each of a plurality of frequency ranges, may be stored in the memory.

According to an embodiment of the disclosure, the electronic device 201 may identify the external object 202 using the transmission signal 211 and the reflection signal. The electronic device 201 may identify the external object 202, using the phase and magnitude (e.g., scattering (S) parameter, in-phase/quadrature phase (I/Q) data) of the multiplied frequency signal (or self-frequency signal) of the transmission signal 211 and the reflection signal. For example, the electronic device 201 may identify the distance, type, and/or direction of the external object 202, using the phase and magnitude of the transmission signal 211 and the reflection signal. For example, the electronic device 201 may identify a distance between the external object 202 and the electronic device 201. The electronic device 201 may identify the type of the external object 202 (e.g., a human, metal, non-metal, or the like). The electronic device 201 may identify a direction relative to the electronic device 201 of the external object 202 by transmitting the transmission signal 211 having directionality and receiving the reflection signal reflected by the external object 202.

According to an embodiment of the disclosure, the electronic device 201 may identify whether the electronic device 201 is blocked, using the multiplied frequency signal (or self-frequency signal) of the transmission signal 211 and the reflection signal. For example, when the external object 202 is identified as being located within the specified first distance (e.g., when the difference in magnitude between the transmission signal 211 and the reflection signal is within the specified first range), it may be determined that the electronic device 201 is in a first state (e.g., a blockage state). For another example, when it is identified that the external object 202 is not less than the specified first distance and is located within the specified second distance (e.g., when the difference in magnitude between the transmission signal 211 and the reflection signal is within the second range), it may be determined that the electronic device 201 is in a second state (e.g., a state where it is located to be adjacent to an external object).

According to an embodiment of the disclosure, the electronic device 201 may control various operations of the electronic device 201 based on the state of the electronic device 201. The electronic device 201 may control the transmission power of the electronic device 201 based on the state of the electronic device 201. For example, when the external object 202 is located within the specified distance, the electronic device 201 may reduce the transmission power of the electronic device 201. For another example, when the external object 202 is located within a specified distance and is identified as a person, the electronic device 201 may reduce the transmission power of the electronic device 201. When the determined state of the electronic device 201 satisfies a specified condition (e.g., a specific absorption rate (SAR) condition), the electronic device 201 may perform transmission power backoff. When the blockage for a specific direction of the electronic device 201 is detected, the electronic device 201 may change the directionality of the transmission signal 211 of the electronic device 201. For example, the electronic device 201 may perform beamforming on the transmission signal 211 in a direction in which the external object 202 is not detected. The electronic device 201 may deliver information of the identified external object to a sensor hub processor (e.g., the sensor module 176 of FIG. 1) of the electronic device 201. For example, the electronic device 201 may deliver information about the state of the electronic device to the sensor hub processor, through the interface between the communication processor and the sensor hub processor of the electronic device 201.

Referring to FIG. 2, it has been described that the electronic device 201 uses a reflection signal from the external object 202, but the electronic device 201 may not use the reflection signal. For example, when the external object 202 is not present or is located at a long distance from the electronic device 201, the electronic device 201 may not obtain or detect the reflection signal. In this case, the electronic device 201 may determine the state of the electronic device 201 as, for example, a free air state. Even when the electronic device 201 is in the free air state, a part of the signal to be transmitted using an antenna by the electronic device 201 may not be radiated and may be reflected by the antenna of the electronic device 201. In this case, the electronic device 201 may determine whether the electronic device 201 is in the free air state, using a reflected signal that is not radiated to the free air state.

The above-described state determination of the electronic device 201 and operations of the electronic device 201 are exemplary, and embodiments of the disclosure are not limited thereto. Hereinafter, structures of the electronic device 201 according to various embodiments of the disclosure may be described with reference to FIGS. 3 to 10. The structures of FIGS. 3 to 10 are exemplary, and any communication device using the self-frequency and multiplied frequency may correspond to the electronic device 201 of the disclosure.

Figure 3:
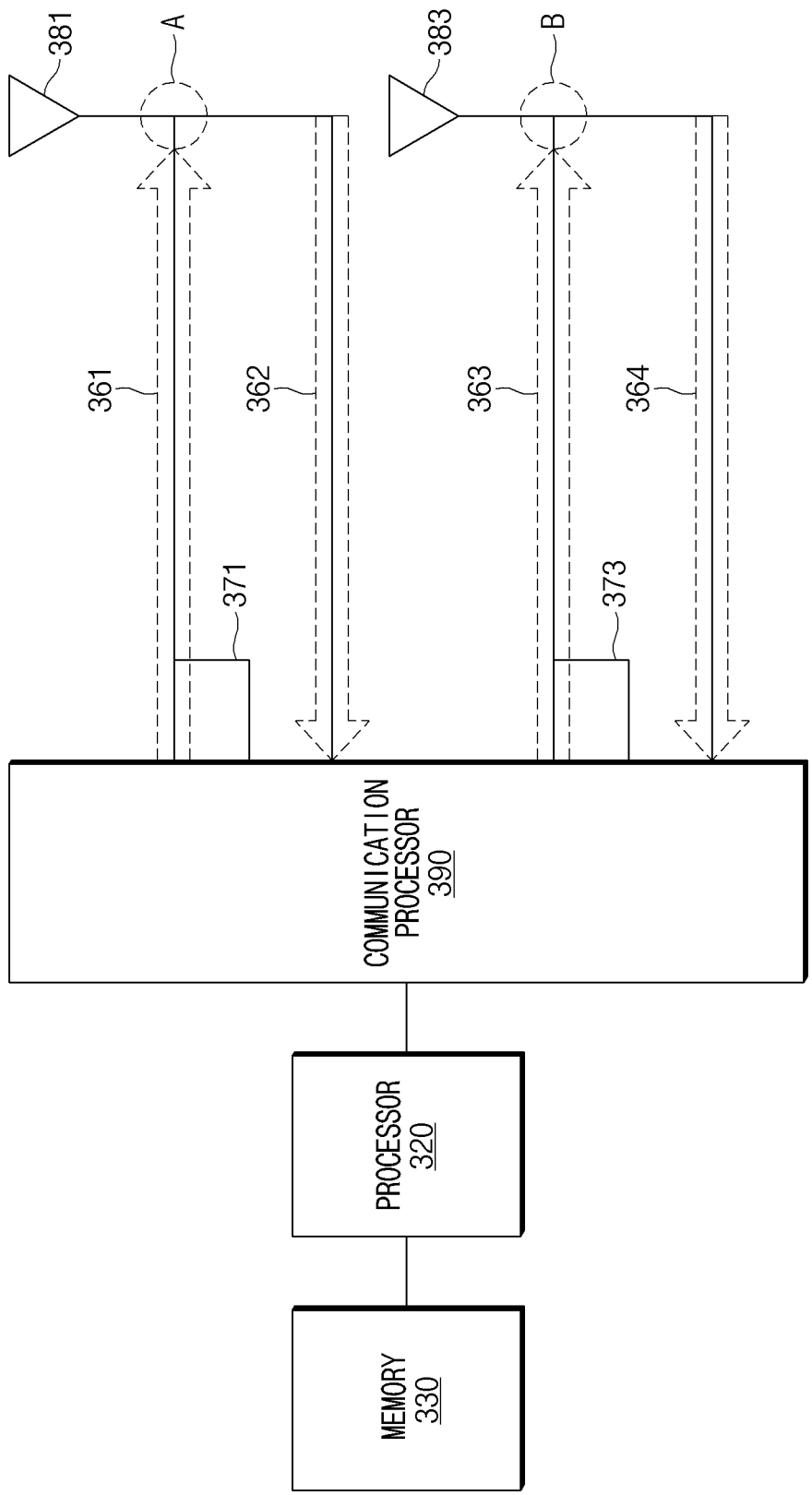
FIG. 3 illustrates transmission paths of an electronic device according to an embodiment of the disclosure.

FIG. 3 illustrates transmission paths of an electronic device according to an embodiment of the disclosure.

According to various embodiments of the disclosure, an electronic device (e.g., the electronic device 201 of FIG. 2) may include at least one transmission path and at least one reception path. In the exemplification of FIG. 3, the electronic device 201 includes two transmission paths and two reception paths, but the configuration of the electronic device 201 is not limited thereto.

Referring to FIG. 3, the electronic device 201 may include a communication processor 390 (e.g., the communication module 190 of FIG. 1) configured to transmit and receive signals using a first antenna 381 and/or a second antenna 383. The electronic device 201 may include a processor 320 (e.g., the processor 120 in FIG. 1) operatively connected to the communication processor 390 and a memory 330 (e.g., the memory 130 of FIG. 1) operatively connected to the communication processor 390. For example, the memory 330 may store one or more instructions that cause the processor 320 and/or the communication processor 390 to perform various operations of the electronic device 201.

The communication processor 390 may be configured to transmit a signal in the first band, using the first antenna 381. The first antenna 381 may have an electrical length corresponding to the first band. The communication processor 390 may transmit a signal of a first frequency belonging to the first band, through a first transmission path 361. The first transmission path 361 may be connected to a first feedback path 371. The first feedback path 371 may be connected to the first transmission path 361 through a coupler. For example, the communication processor 390 may obtain a transmission signal passing through the first transmission path 361 and/or a reflection signal associated with the transmission signal entered into the first antenna 381, through the first feedback path 371. The communication processor 390 may be configured to receive a signal in the first band, using the first antenna 381. For example, the communication processor 390 may receive a signal in the first band, through the first antenna 381 and a first reception path 362 from an external electronic device. For example, a connection part A may include a component (e.g., a switch or duplexer) or structure for selectively connecting the first antenna 381 to the first transmission path 361 or the first reception path 362. In FIG. 3, it is illustrated that the first feedback path 371 is connected to the first transmission path 361 between the connection part A and the communication processor 390, but the first feedback path 371 may be connected between the connection part A and the first antenna 381.

For example, the first transmission path 361 may include a radio frequency (RF) device (e.g., an amplifier) having at least one nonlinear characteristic. When the communication processor 390 transmits a signal of a first frequency, the transmission signal may include a first frequency component and a multiplied frequency component of the first frequency. The communication processor 390 may obtain the transmission signal and reflection signal associated with the first transmission path 361 through the first feedback path 371, and may obtain the magnitude and phase of the first frequency and the multiplied frequency component from the obtained transmission signal and reflection signal.

The communication processor 390 may be configured to transmit a signal in a second band (e.g., a band that does not at least partly overlap with the first band and the upper limit of the band is higher than the upper limit of the first band), using the second antenna 383. The second antenna 383 may have an electrical length corresponding to the second band. The communication processor 390 may transmit a signal of a second frequency belonging to the second band, through a second transmission path 363. The second transmission path 363 may be connected to a second feedback path 373. The second feedback path 373 may be connected to the second transmission path 363 through a coupler. For example, the communication processor 390 may obtain a transmission signal passing through the second transmission path 363 and/or a reflection signal associated with the transmission signal entered into the second antenna 383, through the second feedback path 373. The communication processor 390 may be configured to receive a signal in the second band, using the second antenna 383. For example, the communication processor 390 may receive a signal in the second band, through the second antenna 383 and a second reception path 364 from an external electronic device. For example, a connection part B may include a component (e.g., a switch or duplexer) or structure for selectively connecting the second antenna 383 to the second transmission path 363 or the second reception path 364. In FIG. 3, it is illustrated that the second feedback path 373 is connected to the second transmission path 363 between the connection part B and the communication processor 390, but the second feedback path 373 may be connected between the connection part B and the second antenna 383.

For example, the second transmission path 363 may include an RF device (e.g., an amplifier) having at least one nonlinear characteristic. When the communication processor 390 transmits a signal of a second frequency, the transmission signal may include a second frequency component and a multiplied frequency component of the second frequency. The communication processor 390 may obtain the transmission signal and reflection signal associated with the second transmission path 363 through the second feedback path 373, and may obtain the magnitude and phase of the second frequency and the multiplied frequency component from the obtained transmission signal and reflection signal.

For example, the communication processor 390 may determine the state of the electronic device 201 based on the magnitude and phase obtained through the first feedback path 371 and/or the second feedback path 373. In this case, the communication processor 390 may determine the state of the electronic device 201 by comparing the obtained magnitude and phase with values stored in the memory 330. For another example, the communication processor 390 may deliver the obtained magnitude and phase to the processor 320. In this case, the processor 320 may determine the state of the electronic device 201 by comparing the magnitude and phase with values stored in the memory 330.

With regard to FIG. 3, the first band and the second band have been described as different bands, but the first band and the second band may be the same band as each other. The first antenna 381 and/or the second antenna 383 may include a plurality of antenna elements arranged to perform beamforming.

Hereinafter, for convenience of description, structures of the first transmission path 361 will be described with reference to FIGS. 4 to 7. Unless otherwise described, the second transmission path 363 may have a structure similar to the first transmission path 361 to be described later.

Figure 4:
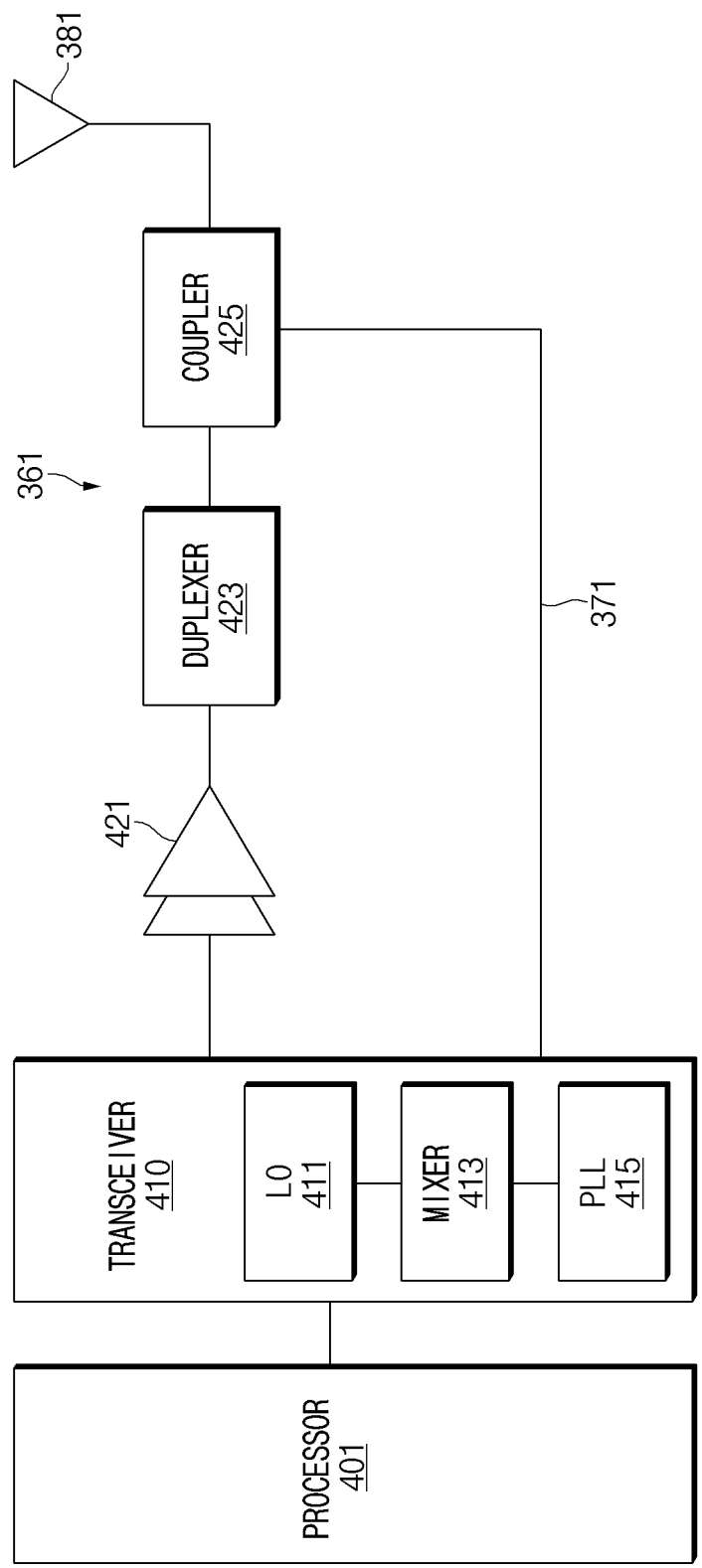
FIG. 4 illustrates a configuration of a transmission path of an electronic device according to an embodiment of the disclosure.

FIG. 4 illustrates a configuration of a transmission path of an electronic device according to an embodiment of the disclosure.

Referring to FIG. 4, according to an embodiment of the disclosure, an electronic device (e.g., the electronic device 201 in FIG. 2) may include a processor 401 (e.g., the processor 320 and/or the communication processor 390 in FIG. 3) and a transceiver 410. The transceiver 410 may be configured to transmit a signal through the first transmission path 361. For example, the transceiver 410 may transmit a signal through the first transmission path 361 and may obtain a transmission signal and a reflection signal through the first feedback path 371.

For example, the first transmission path 361 may include an amplifier 421 configured to amplify a signal, and a duplexer 423 that connects the first antenna 381 to the first transmission path 361 or the reception path (e.g., the first reception path 362 of FIG. 3). The configuration of the first transmission path 361 illustrated in FIG. 4 is exemplary, and the first transmission path 361 may further include at least one configuration not illustrated in FIG. 4. For example, the first transmission path 361 may be one of a plurality of transmission/reception paths included in a wireless communication circuit (e.g., an RF front end).

The first feedback path 371 may be connected to the first transmission path 361 through a coupler 425 between the duplexer 423 and the first antenna 381. For example, the coupler 425 may be implemented with a single wireless communication circuit together with the amplifier 421 and the duplexer 423 or may be implemented with a separate configuration from the wireless communication circuit.

According to an embodiment of the disclosure, the processor 401 may sequentially obtain a self-frequency signal component and a multiplied frequency signal component, using the transceiver 410. For example, the processor 401 may transmit a first signal of a first frequency through the first transmission path 361. Upon transmitting the first signal, the processor 401 may obtain a first signal and a reflection signal of the first signal through the first feedback path 371. The processor 401 may obtain the phase and magnitude of the signal component of the reflection signal and the first signal corresponding to the self-frequency (e.g., a first frequency) of the first signal, using the transceiver 410 upon transmitting the first signal, and then may sequentially obtain the phase and magnitude of the signal component of the reflection signal and the first signal corresponding to the multiplied frequency (e.g., a frequency corresponding to an integer multiple of the first frequency) of the first signal, using the transceiver 410. For example, the processor 401 may set a local oscillator (LO) 411, a mixer 413, and a phase locked loop (PLL) 415 of the transceiver 410 to correspond to the self-frequency of the first signal, and then may obtain the phase and magnitude of the signal component corresponding to the self-frequency of the first signal and reflection signal. Afterward, the processor 401 may set the LO 411, the mixer 413, and the PLL 415 to correspond to the multiplied frequency of the first signal, and then may obtain the phase and magnitude of the signal component corresponding to the multiplied frequency of the first signal and reflection signal. The processor 401 may determine the state of the electronic device 201 from the first signal and reflection signal, using the phase and magnitude of the signal component of the self-frequency and the signal component of the multiplied frequency. For example, the processor 401 may determine the state of the electronic device 201 by comparing values stored in the memory (e.g., the memory 330 in FIG. 3) with a phase and magnitude.

It has been described with reference to FIG. 4 that the processor 401 sequentially obtains the self-frequency signal component, and the multiplied frequency signal component, but embodiments of the disclosure are not limited thereto. For example, the transceiver 410 may be configured to simultaneously obtain the self-frequency signal component and the multiplied frequency signal component through the first feedback path 371. In FIG. 4, the first feedback path 371 is shown as a single path, but the first feedback path 371 may include a feedback path of the transmission signal (e.g., a first signal) and a feedback path of the reflection signal.

Figure 5:
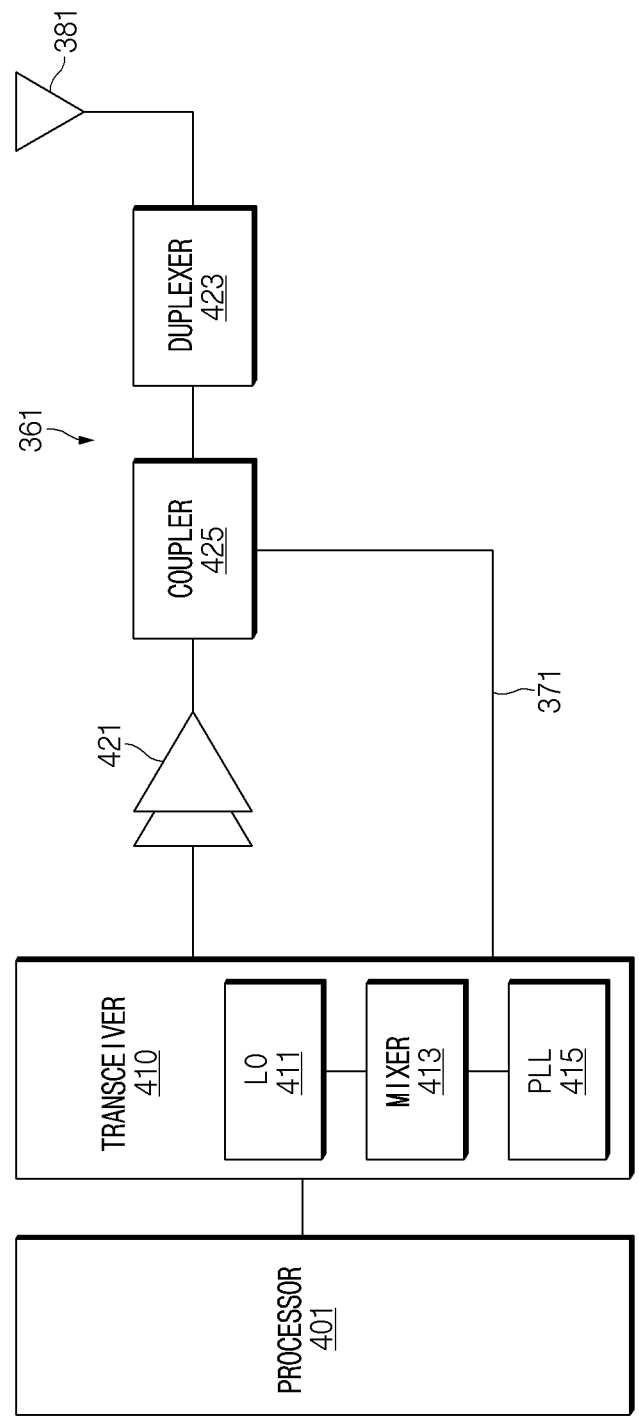
FIG. 5 illustrates a configuration of a transmission path of an electronic device according to an embodiment of the disclosure.

FIG. 5 illustrates a configuration of a transmission path of an electronic device according to an embodiment of the disclosure.

Referring to FIG. 5, unless otherwise described, the descriptions described above with respect to FIG. 4 may be identically applied to FIG. 5. Unlike the exemplification of FIG. 4, in FIG. 5, the first feedback path 371 may be positioned on a first transmission path 361 through the coupler 425 positioned between the amplifier 421 and the duplexer 423 of the first transmission path 361. For example, the duplexer 423 may operate as a filter configured to pass a signal (e.g., a first frequency signal) component of a frequency associated with the first antenna 381. In this case, the harmonic component of a transmission signal passing through the duplexer 423 may be reduced. Accordingly, the transceiver 410 may better detect the signal component of the multiplied frequency of the first signal by positioning the coupler 425 in front of the duplexer 423 (e.g., in terms of the traveling direction of a transmission signal).

Figure 6:
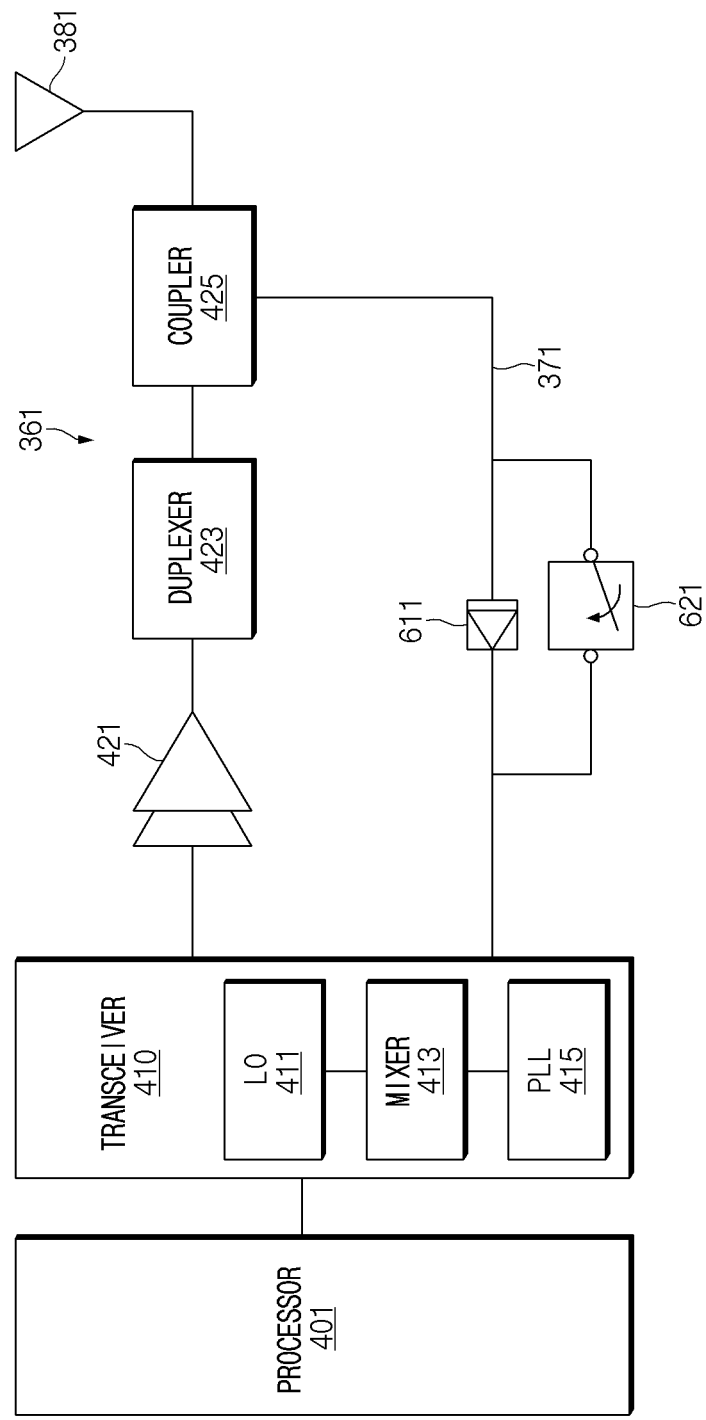
FIG. 6 illustrates a configuration of a transmission path of an electronic device according to an embodiment of the disclosure.

FIG. 6 illustrates a configuration of a transmission path of an electronic device according to an embodiment of the disclosure.

Referring to FIG. 6, unless otherwise described, the descriptions described above with reference to FIG. 4 may be identically applied to FIG. 6. Unlike the exemplification of FIG. 4, the first feedback path 371 of FIG. 6 may include a bypass path and an amplification path. For example, the multiplied frequency signal component of the first signal may be reduced by the duplexer 423. In this case, an amplifier 611 (e.g., a low noise amplifier (LNA)) may be used to amplify the multiplied frequency signal component. For example, to obtain a signal component of a multiplied frequency of the first signal, the transceiver 410 may open a switch 621 and may amplify the signal component of the multiplied frequency through the amplifier 611. To obtain the self-frequency signal component of the first signal, the transceiver 410 may short the switch 621 to bypass the signal obtained from the coupler 425 to the path including the switch 621. As described later with reference to FIG. 7, the amplification path may include at least one filter (e.g., a band pass filter) for more accurate extraction of the multiplied frequency signal component.

Figure 7:
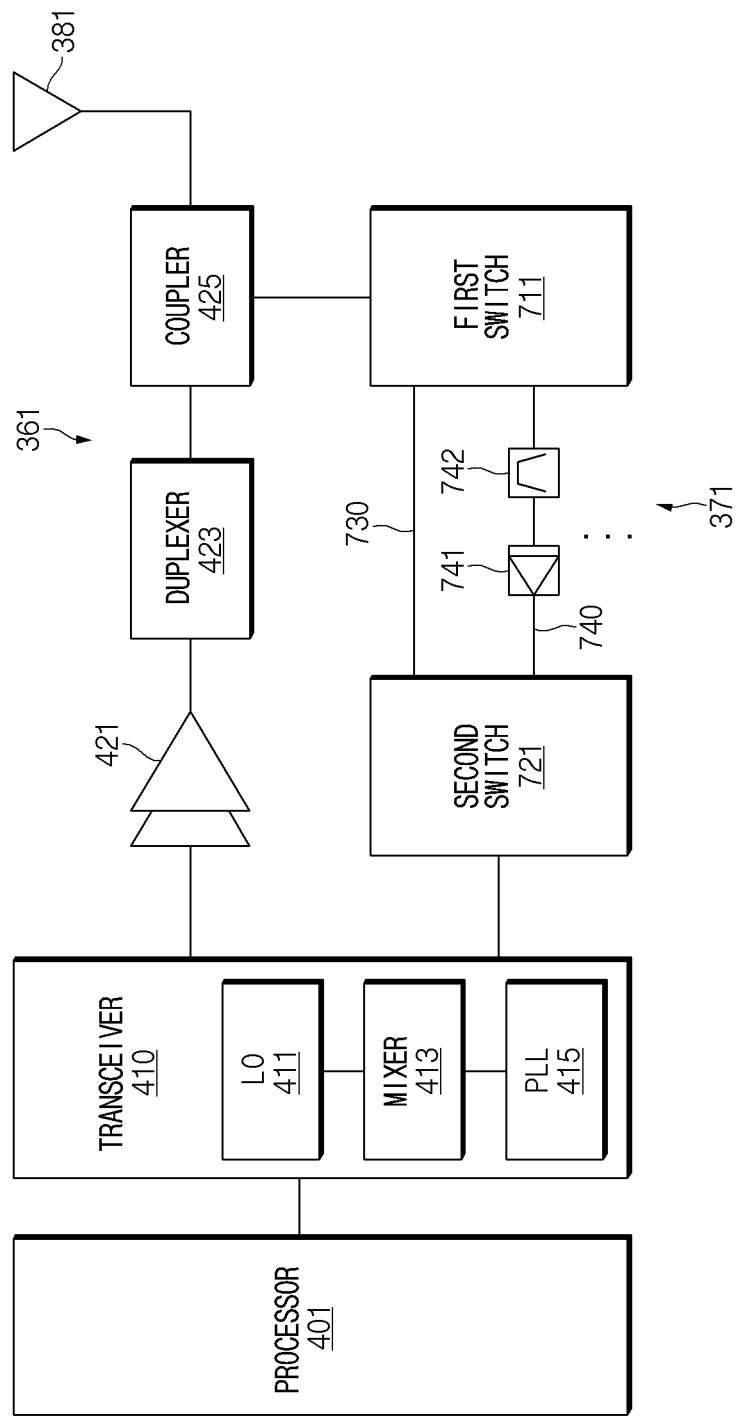
FIG. 7 illustrates a configuration of a transmission path of an electronic device according to an embodiment of the disclosure.

FIG. 7 illustrates a configuration of a transmission path of an electronic device according to an embodiment of the disclosure.

Referring to FIG. 7, unless otherwise described, the descriptions described above with reference to FIGS. 4 and 6 may be identically applied to FIG. 7. In FIG. 7, the first feedback path 371 may include a bypass path 730 for a self-frequency signal component and at least one amplification path (e.g., a first amplification path 740) for a multiplied frequency signal component. For example, each at least one amplification path may include an amplifier and a filter, which are set depending on multiplied frequencies of different frequencies. For example, the first amplification path 740 may include a band pass filter 742 configured to pass a signal corresponding to the multiplied frequency of the first signal.

For example, when the transceiver 410 obtains the self-frequency signal component of the first signal, a first switch 711 may connect the coupler 425 to the bypass path 730, and a second switch 721 may connect the bypass path 730 to the transceiver 410. For another example, when the transceiver 410 obtains the multiplied frequency signal component of the first signal, the first switch 711 may connect the coupler 425 to the first amplification path 740, and the second switch 721 may connect the first amplification path 740 to the transceiver 410. The transceiver 410 may select a path connected between the coupler 425 and the transceiver 410 by controlling the first switch 711 and the second switch 721.

Figure 8:
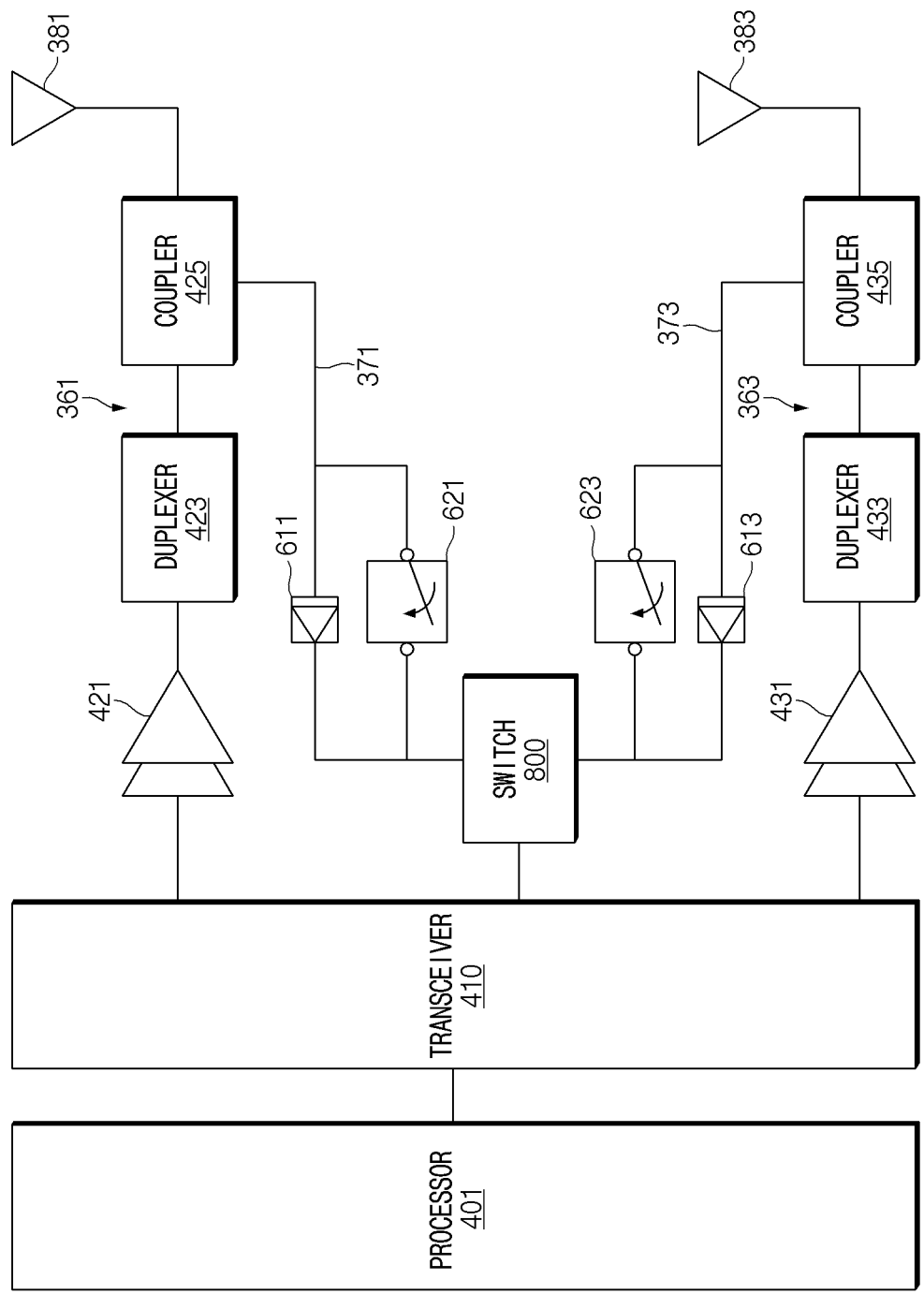
FIG. 8 illustrates a configuration of a transmission path of an electronic device according to an embodiment of the disclosure.

FIG. 8 illustrates a configuration of a transmission path of an electronic device according to an embodiment of the disclosure.

Referring to FIG. 8, unless otherwise described, the descriptions described above with reference to FIGS. 4 and 6 may be identically applied to the exemplification of FIG. 8. In the example of FIG. 8, the first feedback path 371 may be selectively connected to the transceiver 410 through a switch 800. For example, the transceiver 410 may control the switch 800 to connect the first feedback path 371 or the second feedback path 373 to the transceiver 410.

The transceiver 410 may be configured to transmit a second signal through the second transmission path 363. For example, the transceiver 410 may transmit a signal through the second transmission path 363 and may obtain a transmission signal and a reflection signal through the second feedback path 373. For example, the second transmission path 363 may include an amplifier 431 configured to amplify a signal, and a duplexer 433 that connects the second antenna 383 to the second transmission path 363 or the reception path (e.g., the second reception path 364 of FIG. 3). The configuration of the second transmission path 363 illustrated in FIG. 8 is exemplary, and the second transmission path 363 may further include at least one configuration not illustrated in FIG. 8. The second transmission path 363 may be one of a plurality of transmission/reception paths included in a wireless communication circuit (e.g., an RF front end).

The second feedback path 373 may be connected to the second transmission path 363 through a coupler 435 between the duplexer 433 and the second antenna 383. For example, the coupler 435 may be implemented with a single wireless communication circuit together with the amplifier 431 and the duplexer 433 or may be implemented with a separate configuration from the wireless communication circuit. The first transmission path 361 and the second transmission path 363 may be implemented with a single wireless communication circuit or a separate wireless communication circuit.

The second feedback path 373 of FIG. 6 may include a bypass path and an amplification path. An amplifier 613 (e.g., a LNA) may be used to amplify the multiplied frequency signal component. For example, to obtain a signal component of a multiplied frequency of the second signal, the transceiver 410 may open a switch 623 and may amplify the signal component of the multiplied frequency of the second signal through the amplifier 613. To obtain the self-frequency signal component of the second signal, the transceiver 410 may short the switch 623 to bypass the signal obtained from the coupler 435 to the path including the switch 623. As described above with reference to FIG. 7, the amplification path may include at least one filter (e.g., a band pass filter) for more accurate extraction of the multiplied frequency signal component.

In the exemplification of FIG. 8, the transceiver 410 may control the switch 800 to obtain signal components from the first feedback path 371 or the second feedback path 373.

Figure 9:
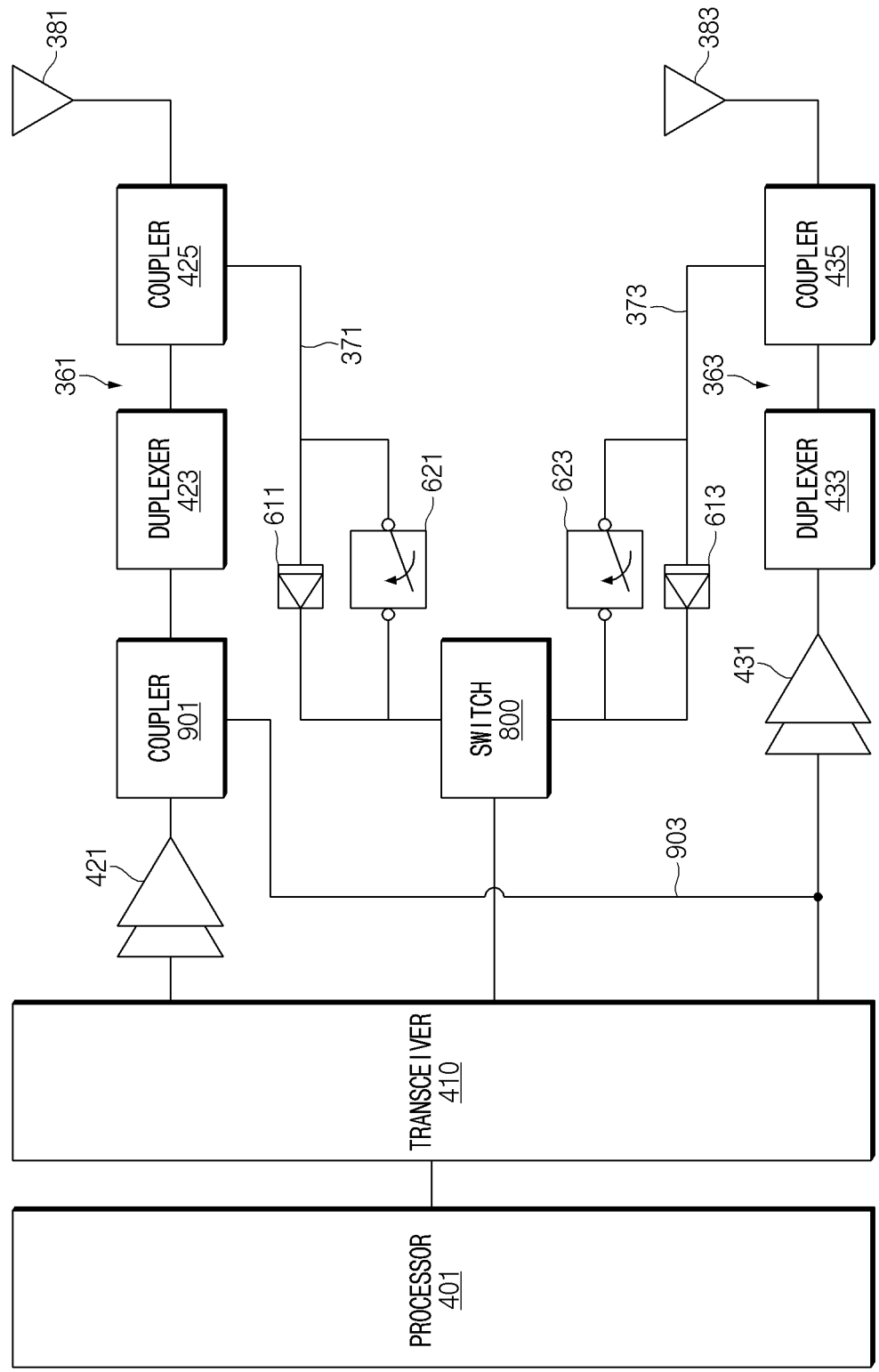
FIG. 9 illustrates a configuration of a transmission path of an electronic device according to an embodiment of the disclosure.

FIG. 9 illustrates a configuration of a transmission path of an electronic device according to an embodiment of the disclosure.

Referring to FIG. 9, unless otherwise described, the descriptions described above with reference to FIGS. 4, 6, and 8 may be identically applied to the exemplification of FIG. 9. In the exemplification of FIG. 9, the processor 401 may be configured to transmit a first signal in a first frequency band through the first transmission path 361 using the transceiver 410 and to transmit the second signal in the second frequency band through the second transmission path 363 using the transceiver 410. For example, the second frequency band may include at least one multiplied frequency of the first signal. According to an embodiment of the disclosure, the processor 401 may obtain the multiplied frequency signal component of the first signal through the second feedback path 373 connected to the second transmission path 363. For example, the processor 401 may transmit a first signal through the first transmission path 361. In this case, the first signal may be entered into the second transmission path 363 through a coupler 901 after passing through the first amplifier 421. Because the first signal passes through the first amplifier 421 and then is entered into the second transmission path 363, the second transmission path 363 may receive a signal including a multiplied frequency signal component of the first signal. For example, the transceiver 410 may amplify the entered first signal using the second amplifier 431. The second amplifier 431 may be configured to amplify a signal in a second frequency band. Accordingly, the second amplifier 431 may amplify the multiplied frequency signal component of the first signal. In this case, the transceiver 410 may obtain the multiplied frequency signal component of the first signal amplified by the second amplifier 431 through a bypass path (e.g., the path passing through the switch 623 and the switch 800) of the second feedback path 373. In this case, the harmonic component of the first signal of the first frequency band may be obtained using the second feedback path 373. Accordingly, the first feedback path 371 may include only a bypass path for obtaining only the self-frequency signal component of the first signal. In this case, the switch 621 and the amplifier 611 may be omitted.

Figure 10:
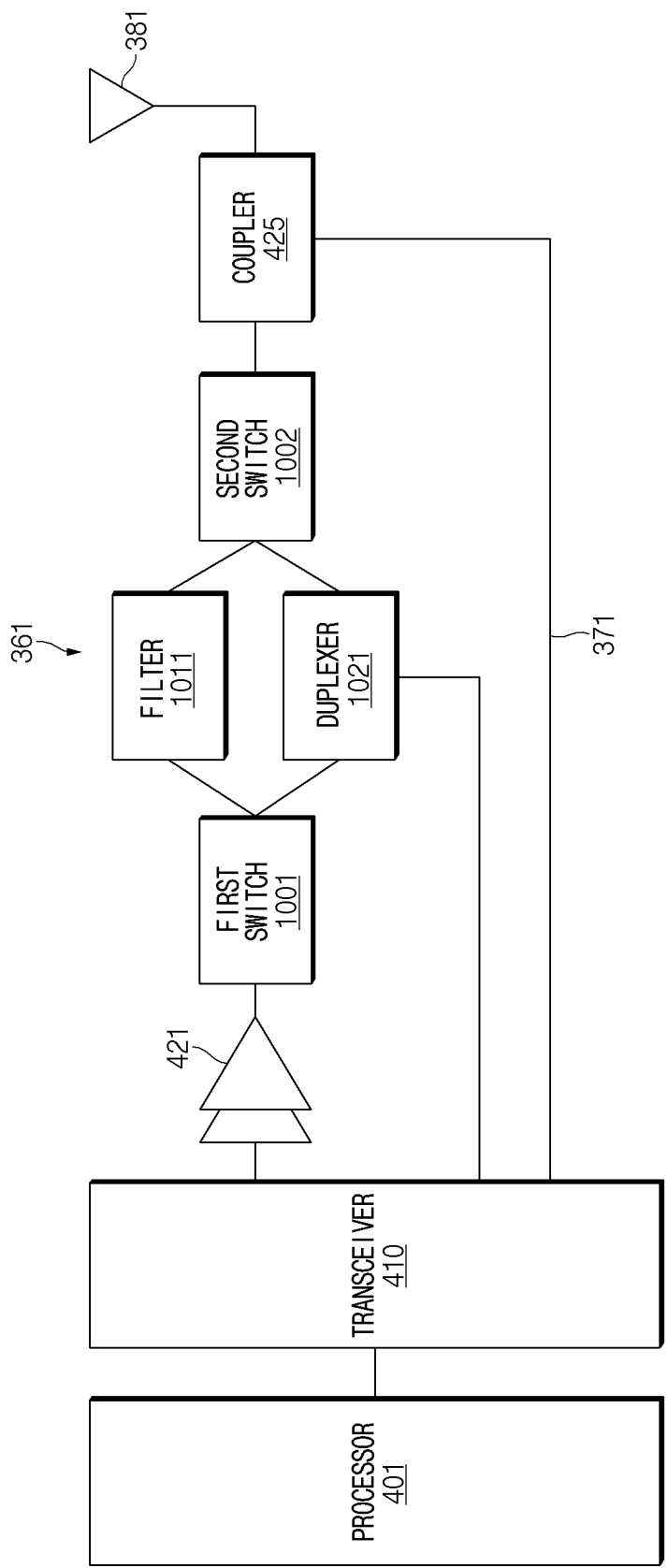
FIG. 10 illustrates a configuration of a transmission path of an electronic device according to an embodiment of the disclosure.

FIG. 10 illustrates a configuration of a transmission path of an electronic device according to an embodiment. of the disclosure Referring to FIG. 10, unless otherwise described, the descriptions described above with reference to FIG. 4 may be identically applied to FIG. 10. According to an embodiment of the disclosure, the first transmission path 361 may further include a separate bypass path for bypassing the multiplied frequency signal component. For example, the bypass path may include a filter 1011 configured to pass a multiplied frequency signal component. A duplexer 1021 (e.g., the duplexer 423 in FIG. 4) may be configured to connect the first antenna 381 to the first transmission path 361 or a reception path (e.g., the first reception path 362 in FIG. 3).

To detect the self-frequency signal component, the transceiver 410 may control a first switch 1001 and a second switch 1002 such that a first signal is delivered to the first antenna 381 through a path passing through the duplexer 1021. In this case, the transceiver 410 may obtain the self-frequency signal component through the first feedback path 371.

To detect the multiplied frequency signal component, the transceiver 410 may control the first switch 1001 and the second switch 1002 such that the first signal flows to the path passing through the filter 1011. In this case, the transceiver 410 may obtain a multiplied frequency signal component through the first feedback path 371.

Figure 11:
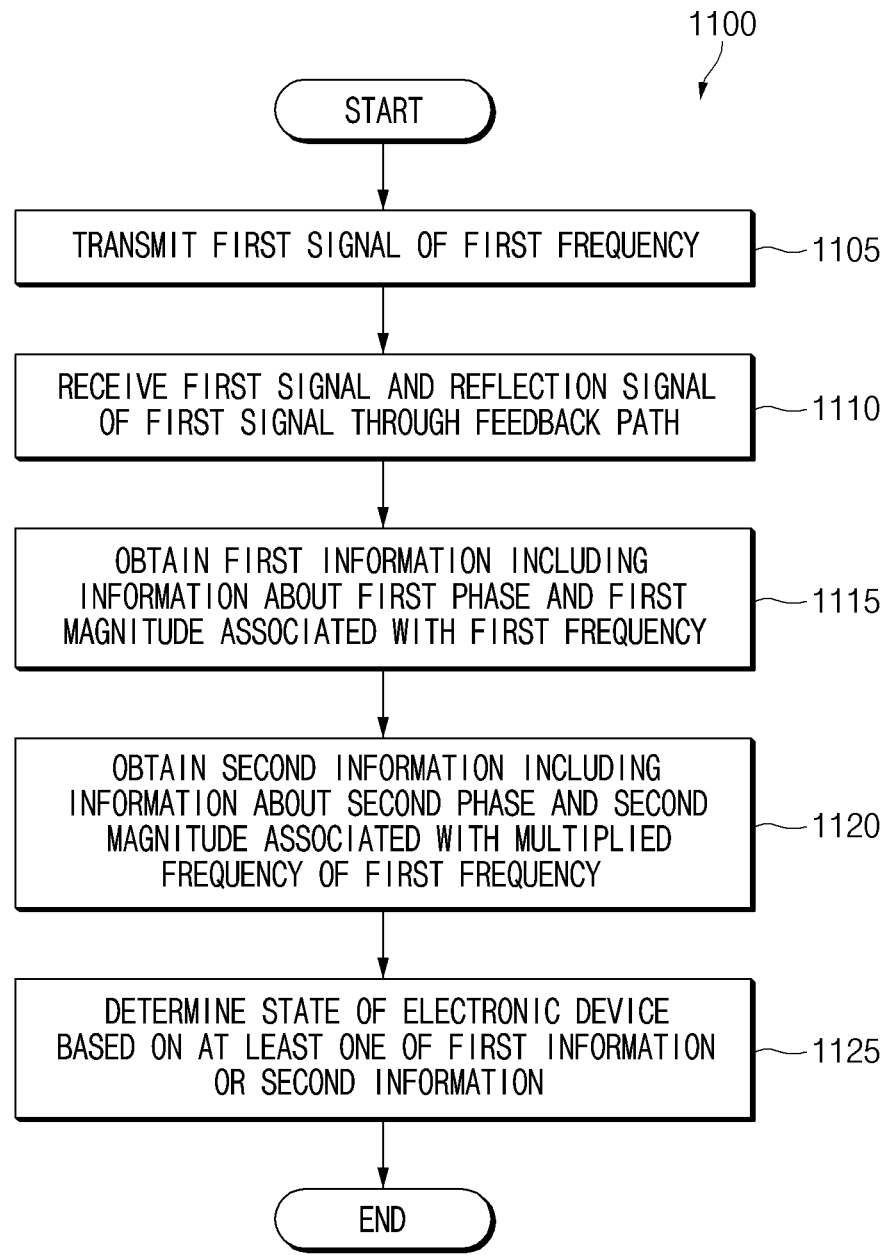
FIG. 11 is a flowchart of a method of determining a state of an electronic device according to various embodiments of the disclosure.

FIG. 11 is a flowchart 1100 of a method of determining a state of an electronic device according to various embodiments of the disclosure.

An electronic device (e.g., the electronic device 201 of FIG. 2) may include at least one antenna (e.g., the first antenna 381 and/or the second antenna 383 of FIG. 3), at least one transmission path (e.g., the first transmission path 361 and/or the second transmission path 363 of FIG. 3) connected to at least one antenna, a transceiver (e.g., the transceiver 410 of FIG. 4) connected to a transmission path, at least one feedback path (e.g., the first feedback path 371 and/or second feedback path 373 of FIG. 3) connected between a transmission path and a transceiver, at least one processor (e.g., the processor 401 of FIG. 4) connected to a transceiver, and a memory (e.g., the memory 330 of FIG. 3) connected to at least one processor. The at least one transmission path may include at least one amplifier (e.g., the first amplifier 421 of FIG. 4 and/or the second amplifier 431 of FIG. 8). The transceiver may be configured to convert (e.g., up-converting or down-converting) a signal. The memory may store instructions that, when executed, cause the processor to perform various operations to be described.

Referring to FIG. 11, in operation 1105, at least one processor may transmit a first signal of a first frequency. For example, at least one processor may transmit a first signal through a first transmission path (e.g., the first transmission path 361 in FIG. 4) using a transceiver. For example, the first transmission path may include at least one amplifier (e.g., the amplifier 421 of FIG. 4). A harmonic component corresponding to the multiplied frequency of the first frequency may be generated due to the nonlinear amplification characteristic of the at least one amplifier.

In operation 1110, the at least one processor may receive the first signal and the reflection signal of the first signal through a feedback path (e.g., the first feedback path 371 of FIG. 4). For example, the reflection signal may be a signal induced by the antenna by the first signal when the first signal is transmitted through the antenna connected to the first path.

In operation 1115, at least one processor may obtain first information including information about a first phase and a first magnitude associated with the first frequency. At least one processor may obtain the first information from the first signal and the reflection signal. For example, the feedback path may include a bypass path (e.g., a path passing through the switch 621 of FIG. 6) for bypassing a signal corresponding to the self-frequency of the first signal. The at least one processor may obtain a signal component corresponding to the self-frequency of the first signal through the bypass path.

In operation 1120, the at least one processor may obtain second information including information about a second phase and a second magnitude associated with the multiplied frequency of the first frequency. For example, the multiplied frequency may be referred to as a frequency corresponding to N times (e.g., N is an integer of 2 or more) as many as the first frequency. The at least one processor may obtain the second information from a first signal and a reflection signal. For example, the feedback path may include an amplification path (e.g., a path passing through the amplifier 611 of FIG. 6) for amplifying a signal corresponding to the multiplied frequency of the first signal. For example, the amplification path may include a filter (e.g., the filter 742 of FIG. 7) configured to pass only the signal component corresponding to the multiplied frequency. The at least one processor may obtain a signal component corresponding to the multiplied frequency of the first signal through an amplification path. As described above in reference to FIGS. 4 to 10, the at least one processor may sequentially obtain the first information and the second information, or may obtain the first information and the second information substantially simultaneously.

In operation 1120, the embodiment has been described focused on a single multiplied frequency, but the embodiments of the disclosure are not limited thereto. The at least one processor may obtain the second information including information about phases and magnitudes associated with a plurality of multiplied frequencies.

In operation 1125, the at least one processor may determine the state of the electronic device based on at least one of the first information or the second information. For example, the state of the electronic device may include whether the electronic device is blocked and/or the identification of an external object adjacent to the electronic device. The at least one processor may determine the state of the electronic device by comparing the first information and/or the second information of the first signal and the reflection signal with values stored in the memory (e.g., the memory 130 in FIG. 1).

According to an embodiment of the disclosure, the at least one processor may identify an external object using the first signal and the reflection signal. For example, at least one processor may identify a distance, type (e.g., a human, metal, non-metal, or the like), and/or direction of an external object. According to an embodiment of the disclosure, the at least one processor may identify whether the electronic device is blocked, using the first signal and the reflection signal. For example, when it is identified that the external object is located within the specified first distance, the at least one processor may determine that the electronic device is in a first state (e.g., a blockage state).

According to an embodiment of the disclosure, the at least one processor may control various operations of the electronic device based on the state of the electronic device. For example, the at least one processor may adjust the transmission power of the electronic device, based on the distance and/or type of the external object.

According to embodiments disclosed in the specification, an electronic device may determine a state of the electronic device, using a multiplied frequency component.

According to embodiments disclosed in the specification, an electronic device may provide the improved recognition and distance recognition of an external object.

Besides, a variety of effects directly or indirectly understood through the disclosure may be provided.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
    an antenna;
    a transmission path electrically connected to the antenna and including at least one amplifier;
    a transceiver connected to the transmission path and configured to convert a signal;
    a feedback path connected between the transmission path and the transceiver;
    at least one processor connected to the transceiver and configured to communicate with at least one external electronic device by using the transceiver; and
    a memory connected to the at least one processor, wherein the memory stores one or more instructions that, when executed, cause the at least one processor to:
        transmit a first signal of a first frequency through the transmission path, using the transceiver,
        obtain a transmission signal and a reflection signal of the transmission signal, which are associated with transmission of the first signal, through the feedback path using the transceiver,
        obtain first information about a first phase and a first magnitude, which are associated with the first frequency, and second information about a second phase and a second magnitude, which are associated with a multiplied frequency of the first frequency, from the transmission signal and the reflection signal using the transceiver, and
        determine a state of the electronic device based on the first information and the second information.

2. The electronic device of claim 1,
    wherein the one or more instructions, when executed, further cause the at least one processor to:
        identify information of an external object based on the first information and the second information, and
        determine the state of the electronic device based on the information of the external object, and
    wherein the information of the external object includes at least one of a distance, direction, or type of the external object.

3. The electronic device of claim 2, wherein the one or more instructions, when executed, further cause the at least one processor to:
    compare the first information and the second information with values stored in the memory to determine the state of the electronic device.

4. The electronic device of claim 2, wherein the one or more instructions, when executed, further cause the at least one processor to:
    adjust transmission power associated with the electronic device based on the state of the electronic device.

5. The electronic device of claim 1, further comprising:
    a duplexer configured to connect the transmission path or a reception path to the antenna,
    wherein the feedback path is coupled to the transmission path through a coupler positioned between the duplexer and the antenna.

6. The electronic device of claim 5, wherein the feedback path includes an amplification path configured to amplify a component corresponding to the multiplied frequency.

7. The electronic device of claim 6, wherein the feedback path further includes a bypass path configured to bypass a component corresponding to the first frequency to the transceiver.

8. The electronic device of claim 6, wherein the amplification path further includes a filter configured to pass the component corresponding to the multiplied frequency.

9. The electronic device of claim 1, further comprising:
    a duplexer configured to connect the transmission path or a reception path to the antenna, wherein the feedback path is coupled to the transmission path through a coupler positioned between the at least one amplifier and the duplexer.

10. The electronic device of claim 1, wherein a component corresponding to the multiplied frequency is generated from a nonlinear characteristics of the at least one amplifier.

11. A method of determining a state of an electronic device, the method comprising:
transmitting a first signal of a first frequency through a transmission path connected to an antenna of the electronic device and including at least one amplifier;
obtaining a transmission signal and a reflection signal of the transmission signal, which are associated with transmission of the first signal, through a feedback path coupled to the transmission path;
obtaining first information about a first phase and a first magnitude, which are associated with the first frequency, and second information about a second phase and a second magnitude, which are associated with a multiplied frequency of the first frequency, from the transmission signal and the reflection signal; and
determining the state of the electronic device based on the first information and the second information.

12. The method of claim 11,
wherein the determining of the state of the electronic device includes:
identifying information of an external object based on the first information and the second information; and
determining the state of the electronic device based on the information of the external object, and
wherein the information of the external object includes at least one of a distance, direction, or type of the external object.

13. The method of claim 11, wherein the determining of the state of the electronic device includes:
comparing the first information and the second information with values stored in a memory of the electronic device to determine the state of the electronic device.

14. The method of claim 12, further comprising:
adjusting transmission power associated with the electronic device based on the state of the electronic device.

15. The method of claim 11,
wherein the transmission path is connected to the antenna through a duplexer connecting the transmission path or a reception path to the antenna, and
wherein the feedback path is coupled to the transmission path through a coupler positioned between the duplexer and the antenna.

16. The method of claim 15, wherein the obtaining of the second information includes:
amplifying a component corresponding to the multiplied frequency, using an amplifier of the feedback path.

17. The method of claim 16, wherein the obtaining of the first information includes:
bypassing a component corresponding to the first frequency to a bypass path of the feedback path.

18. The method of claim 16, wherein the obtaining of the second information further includes:
filtering the component corresponding to the multiplied frequency.

19. The method of claim 11,
wherein the transmission path is connected to the antenna through a duplexer connecting the transmission path or a reception path to the antenna, and
wherein the feedback path is coupled to the transmission path through a coupler positioned between the at least one amplifier and the duplexer.

20. The method of claim 11, wherein a component corresponding to the multiplied frequency is generated from a nonlinear characteristics of the at least one amplifier.

21. The electronic device of claim 1, wherein the reflection signal comprises a signal is reflected back to a communication circuit of the electronic device and reflected by an external object.

* * * * *